United States Patent
Eren et al.

(10) Patent No.: US 10,386,396 B2
(45) Date of Patent: Aug. 20, 2019

(54) HYBRID PLL FOR GRID SYNCHRONIZATION IN DISTRIBUTED GENERATION

(71) Applicants: Suzan Eren, Kingston (CA); Majid Pahlevaninezhad, Kingston (CA); Shangzhi Pan, Kingston (CA); Praveen Jain, Kingston (CA)

(72) Inventors: Suzan Eren, Kingston (CA); Majid Pahlevaninezhad, Kingston (CA); Shangzhi Pan, Kingston (CA); Praveen Jain, Kingston (CA)

(73) Assignee: SPARQ SYSTEMS INC., Kingston (CA)

( * ) Notice: Subject to any disclaimer, the term of this patent is extended or adjusted under 35 U.S.C. 154(b) by 335 days.

(21) Appl. No.: 14/875,993

(22) Filed: Oct. 6, 2015

(65) Prior Publication Data

US 2017/0097380 A1 Apr. 6, 2017

(51) Int. Cl.
| | |
|---|---|
| *G01R 23/02* | (2006.01) |
| *H03L 7/08* | (2006.01) |
| *H02J 3/38* | (2006.01) |
| *G01R 25/00* | (2006.01) |
| *G01R 23/20* | (2006.01) |
| *H03L 5/00* | (2006.01) |

(52) U.S. Cl.
CPC ............. *G01R 23/02* (2013.01); *G01R 23/20* (2013.01); *G01R 25/00* (2013.01); *H02J 3/381* (2013.01); *H03L 5/00* (2013.01); *H03L 7/08* (2013.01)

(58) Field of Classification Search
CPC .......... G01R 23/02; G01R 23/20; G01R 25/00
See application file for complete search history.

(56) References Cited

U.S. PATENT DOCUMENTS

| | | | | |
|---|---|---|---|---|
| 8,067,932 | B2* | 11/2011 | Teodorescu | G01R 19/2513 324/107 |
| 8,751,177 | B2* | 6/2014 | Escobar | G01R 19/2513 324/76.39 |
| 8,972,215 | B2* | 3/2015 | Sahinoglu | G01R 23/15 324/66 |
| 2013/0346004 | A1* | 12/2013 | Hozoi | G01R 15/04 702/66 |

(Continued)

OTHER PUBLICATIONS

Johnson, Jay, et al. "Test Protocols for Advanced Inverter Interoperability Functions—Main Document." Sandia National Laboratories, SAND2013-9880 (2013).

*Primary Examiner* — Tri M Hoang
(74) *Attorney, Agent, or Firm* — Brion Raffoul

(57) ABSTRACT

Systems, methods, and devices relating to the extraction of parameters for a grid voltage. A multi-block hybrid PLL or hybrid observer receives grid voltage. The grid voltage is received by a harmonic/noise decomposer block which separates the harmonic/noise component of the incoming voltage from the clean voltage signal. The clean voltage signal is then output from the PLL/observer. The clean voltage signal is also sent to an amplitude estimator block which estimates the amplitude of the clean voltage signal. The harmonic/noise component of the input voltage signal is sent, along with the clean voltage signal, to a frequency estimator block. The frequency estimator block then determines the phase angle of the incoming signal as well as the frequency of the incoming voltage signal.

7 Claims, 12 Drawing Sheets

(56) References Cited

U.S. PATENT DOCUMENTS

2014/0043014 A1\* 2/2014 Ho .......................... H02J 3/40
                                                                        324/76.19
2017/0207635 A1\* 7/2017 Catalan Lago ........... H02J 3/44

\* cited by examiner

HYBRID PLL FOR GRID SYNCHRONIZATION IN DISTRIBUTED GENERATION

TECHNICAL FIELD

The present invention relates to systems, methods, and devices relating to grid-connected converters for use in a power grid. More specifically, the present invention relates to techniques used to extract grid voltage parameters for use in synchronizing grid connected power converters with the utility grid.

BACKGROUND OF THE INVENTION

Distributed Generators (DGs) for power generation are becoming more prevalent due to their advantages over central power generation methods. By harvesting energy from renewable energy sources, DGs can provide a sustainable solution for future power generation. In order to accommodate a high number of DGs, the utility grid should be able to tolerate relatively high fluctuations in the frequency and amplitude of the grid voltage due to the dynamics the DGs impose on the utility grid. In order to accommodate these fluctuations, the standards for grid-connected power converters have rapidly been changing. The introduction of Rule 21 of "Test Protocols for Advanced Inverter Interoperability Functions" from Sandia National Laboratories for power converters with grid interconnection is one example of these changes.

Grid-connected power converters must be synchronized with the grid voltage. Therefore, synchronization is an inevitable part of the control system for any grid-connected power converter. The grid synchronization block of the control system extracts the phase information of the grid voltage and synchronizes the power converter accordingly. It also extracts other attributes of the grid voltage such as amplitude whenever needed.

The grid synchronization technique should be able to quickly extract the various parameters of the grid voltage even while in the presence of harmonics/noise. In particular, as the number of DGs coupled to the grid increase, there will be a significant amount of variations in the grid voltage. Thus, the synchronization technique must be able to properly synchronize with the grid despite the fluctuations and harmonics/noise in the grid voltage.

Grid synchronizations based on the Adaptive Notch Filter (ANF) PLL and on the Second-Order Generalized Integrator (SOGI) PLL are the current state-of-the-art techniques used for grid synchronization. Both the ANF-based PLL and SOGI-based PLL each utilize two integrators in order to generate orthogonal signals. These orthogonal signals are then used to extract the phase/frequency information. Although these techniques provide a simple and practical solution for grid synchronization, they are susceptible to the harmonic content of the grid voltage. In order to mitigate the impact of harmonics, multiple modules need to be implemented for different harmonics.

FIG. 1 shows the block diagram of the ANF-based PLL (Prior Art) while FIG. 2 shows the block diagram of the SOGI-based PLL (Prior Art). According to FIG. 1 and FIG. 2, both the ANF-based PLL and the SOGI-based PLL use two integrators (i.e., second order generalized integrator) to produce the orthogonal signals. Therefore, in terms of producing orthogonal signals, both methods have the same structure. However, the phase extraction technique from the orthogonal signals is different for the ANF-based PLL and the SOGI-based PLL. For the SOGI-based PLL, phase extraction is based on the dq-transformation (Park transformation) and PI controller for the SOGI-based PLL. For the ANF-based PLL, phase extraction is based on an adaptive algorithm.

Neither the ANF-based PLL nor the SOGI-based PLL is able to precisely extract the attributes of the grid voltage in the presence of harmonics/noise and fluctuations. Therefore, grid-connected power converters require a more effective solution to be able to integrate into future DGs.

Based on the above, there is therefore a need for systems and devices which mitigate if not avoid the shortcomings of the prior art.

SUMMARY OF INVENTION

The present invention provides systems, methods, and devices relating to the extraction of parameters for a grid voltage. A multi-block hybrid PLL or hybrid observer receives grid voltage. The grid voltage is received by a harmonic/noise decomposer block which separates the harmonic/noise component of the incoming voltage from the clean voltage signal. The clean voltage signal is then output from the PLL/observer. The clean voltage signal is also sent to an amplitude estimator block which estimates the amplitude of the clean voltage signal. The harmonic/noise component of the input voltage signal is sent, along with the clean voltage signal, to a frequency estimator block. The frequency estimator block then determines the phase angle of the incoming signal as well as the frequency of the incoming voltage signal.

In a first aspect, the present invention provides a system for determining parameters of an incoming signal, the system comprising:
  a harmonic/noise decomposer block for decomposing said incoming signal into a clean signal and a harmonic/noise component of said incoming signal;
  a frequency estimator block for estimating a frequency and phase angle of said incoming signal, said frequency estimator block receiving said clean signal and said harmonic/noise component of said incoming signal;
  an amplitude estimator block for estimating an amplitude of said incoming signal, said amplitude estimator block receiving said clean signal;
wherein
  said decomposer block outputs said clean signal and said harmonic/noise component;
  said frequency estimator block outputs said frequency and values related to said phase angle of said incoming signal;
  said amplitude estimator block outputs said amplitude of said incoming signal.

BRIEF DESCRIPTION OF THE DRAWINGS

The embodiments of the present invention will now be described by reference to the following figures, in which identical reference numerals in different figures indicate identical elements and in which.

DETAILED DESCRIPTION

Figure 1:
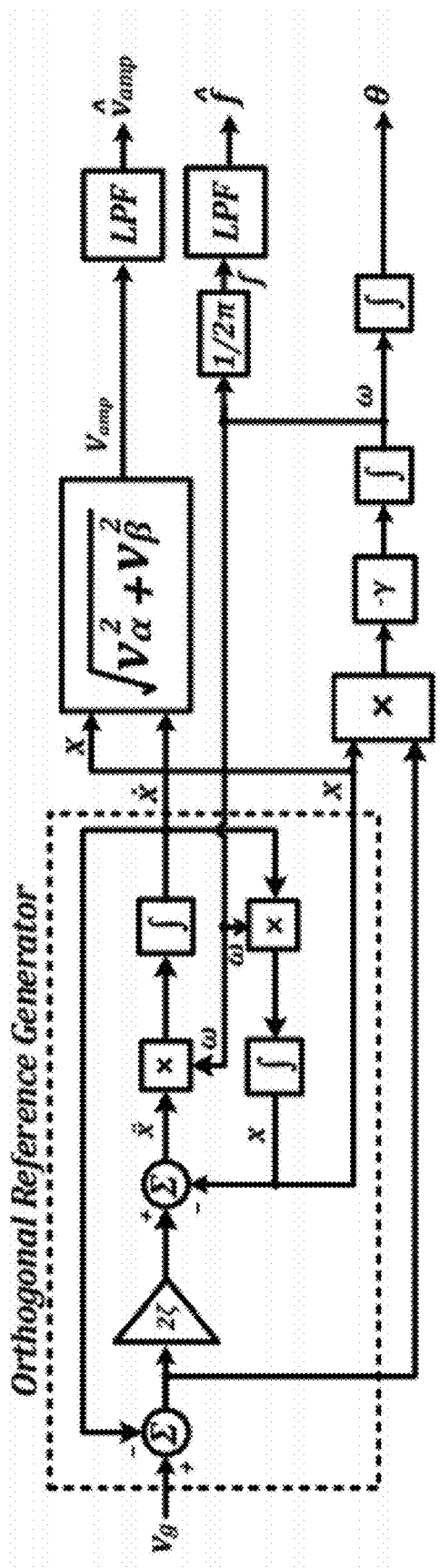
FIG. 1 is a block diagram of an ANF-based PLL according to the prior art.
Figure 2:
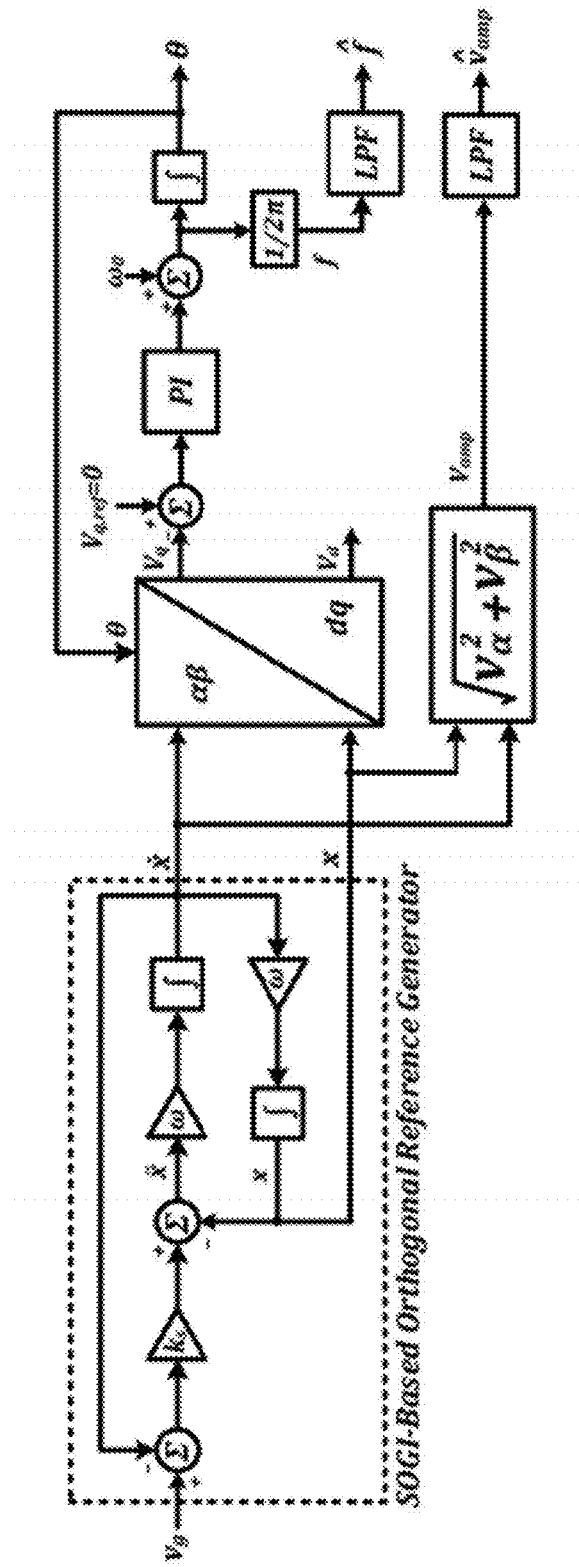
FIG. 2 is a block diagram of a SOGI-based PLL according to the prior art.
Figure 3:
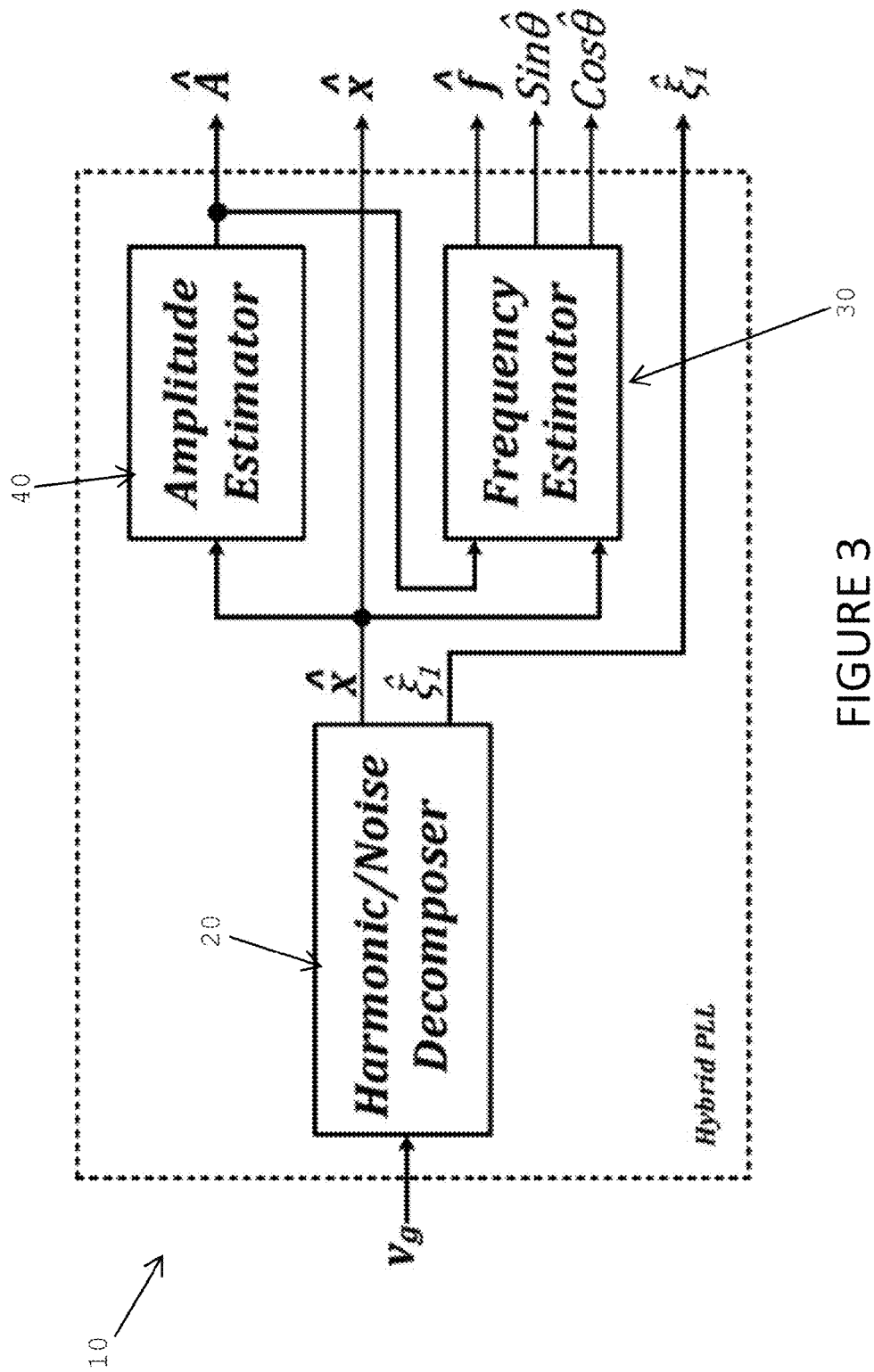
FIG. 3 is a block diagram of a hybrid observer according to one aspect of the present invention.

Referring to FIG. 3, a block diagram of a hybrid observer according to one aspect of the present invention is illustrated. According to FIG. 3, the hybrid observer 10 includes three main blocks: a Harmonic/Noise Decomposer block 20, a Frequency Estimator block 30, and an Amplitude Estimator block 40. In order to decouple the harmonics/noise from the grid voltage signal and to produce a clean sinusoidal signal, the Harmonic/Noise Decomposer block 20 is embedded in the hybrid observer 10. After the signal is decomposed, the Frequency Estimator block 30 then extracts the phase information of the sinusoidal signal. Also, the Amplitude Estimator block 40 calculates the amplitude of the sinusoidal signal.

The Harmonic/Noise Decomposer block 20 must decouple the harmonics/noise content of the grid voltage. The grid voltage is defined as:

$$v_g(t) = A\sin(\omega t + \varphi) + \xi(t) \quad (1)$$

In Eqn. (1) the grid voltage consists of a sinusoidal term with the grid frequency and a term representing the harmonics/Noise content of the grid voltage, namely $\xi(t)$. Eqn. (1) can be rewritten as:

$$v_g(t) = x(t) + \xi(t) \quad (2)$$

where $x(t)$ is the sinusoidal signal with the grid frequency and $\xi(t)$ is the harmonics/noise content of the grid voltage.

In order to decouple the term $\xi(t)$ from the grid voltage, the term $\xi(t)$ must be estimated using the grid voltage $v_g(t)$. To design a suitable estimator, the state variables of the system are defined as follows:

$$X_g^{State\ Vars.}: \begin{cases} x_1 = v_g(t) \\ x_2 = \dfrac{1}{\omega}\dot{x}_1 \end{cases} \quad (3)$$

According to Eqn. (3), the dynamics of the system are given by:

$$X_g^{Dynamic}: \begin{cases} \dot{x}_1 = \omega x_2 \\ \dot{x}_2 = -\omega x_1 + \omega \xi + \dfrac{1}{\omega}\ddot{\xi} \end{cases} \quad (4)$$

In order to estimate the term $\xi(t)$, the following mapping is introduced:

$$\Pi: X \xrightarrow{\mathcal{P}} Y \quad (5)$$

$$\mathcal{Y} = \mathcal{P}\cdot\mathcal{X},$$

$$\mathcal{P} = \begin{pmatrix} 1 & 0 & 0 & 0 \\ -1 & 1 & -1 & -\dfrac{1}{\omega} \\ 0 & 0 & 1 & 0 \\ 0 & 0 & 0 & 1 \end{pmatrix}$$

$$\mathcal{X} = \begin{pmatrix} x_1 \\ x_2 \\ \xi \\ \dot{\xi} \end{pmatrix} \in X,$$

$$\mathcal{Y} = \begin{pmatrix} \vartheta_1 \\ \vartheta_2 \\ \xi_1 \\ \xi_2 \end{pmatrix} \in Y$$

The mapping $$\Pi: X \xrightarrow{\mathcal{P}} Y$$

is a diffeomorphism (i.e., since it is a bijection and invertible and its inverse is differentiable as well). Thus, X and Y are diffeomorphic. It is worthwhile to mention that the importance of this mapping is to make the system observable for the term $\xi(t)$ (i.e., harmonic/noise content of the grid voltage).

The dynamics of the system in Y using the mapping $$\Pi: X \xrightarrow{\mathcal{P}} Y$$

are given by:

$$\mathcal{Y}_g^{Dynamic}: \begin{cases} \dot{\vartheta}_1 = \omega\vartheta_2 + \omega\vartheta_1 + \omega\xi_1 + \xi_2 \\ \dot{\vartheta}_2 = -2\omega\vartheta_1 - \omega\vartheta_2 \\ \dot{\xi}_1 = \xi_2 \\ \dot{\xi}_2 = \ddot{\xi} \end{cases} \quad (6)$$

The observer for the system in in Y is designed as:

$$\Theta_g^{Obs}: \begin{cases} \dot{\hat{\vartheta}}_1 = \omega\hat{\vartheta}_2 + \omega\hat{\vartheta}_1 + \omega\hat{\xi}_1 + \hat{\xi}_2 + \mu_1\tilde{\vartheta}_1 \\ \dot{\hat{\vartheta}}_2 = -2\omega\hat{\vartheta}_1 - \omega\hat{\vartheta}_2 + \mu_2\tilde{\vartheta}_1 \\ \dot{\hat{\xi}}_1 = \hat{\xi}_2 \\ \dot{\hat{\xi}}_2 = \gamma_1\tilde{\vartheta}_1 \end{cases} \quad (7)$$

where $\tilde{\vartheta}_1 = \vartheta_1 - \hat{\vartheta}_1$.

Figure 4:
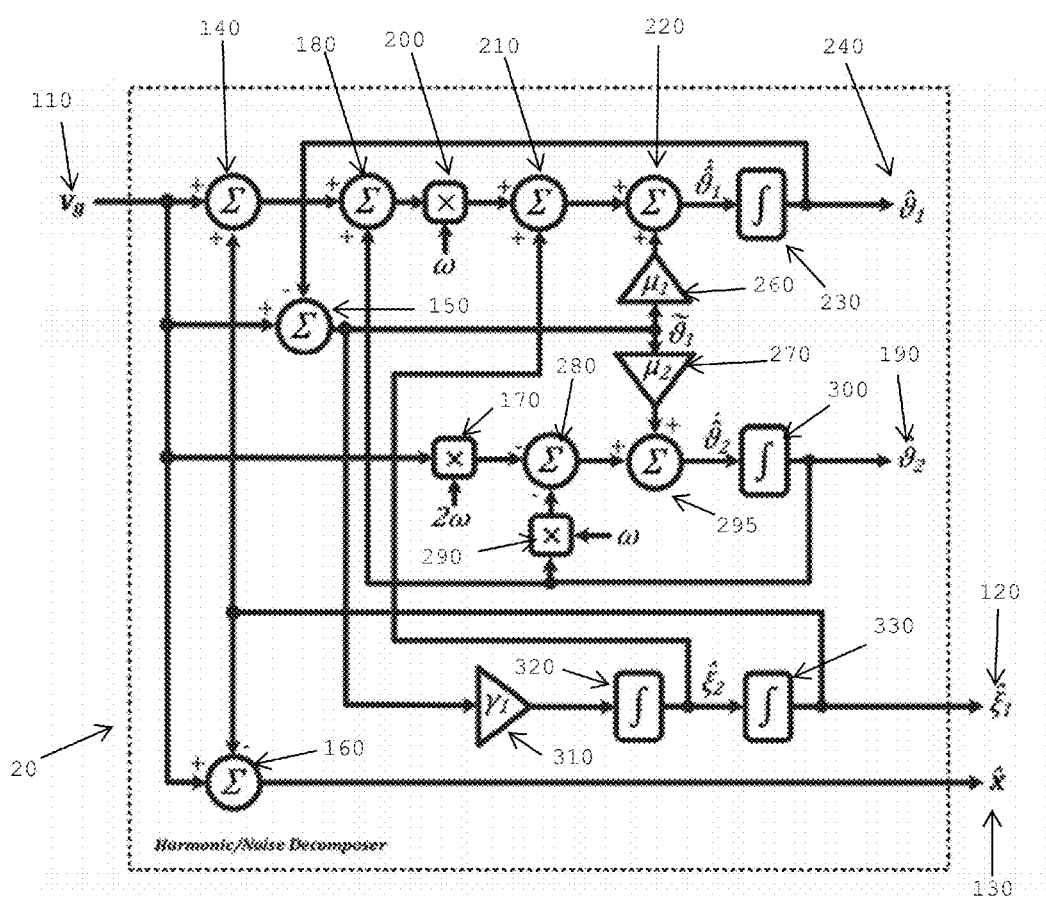
FIG. 4 is a block diagram of a harmonic/noise decomposer block according to another aspect of the invention.

FIG. 4 shows the block diagram of the Harmonic/Noise Decomposer block, which is based on Eqn. (7). The outputs of this block are $\hat{\xi}_1$, which is the estimation of the harmonics/noise, and $\hat{x}$, which is the grid voltage signal without the harmonics/noise content. It is important to mention that the diffeomorphism mapping $$\Pi: X \xrightarrow{\mathcal{P}} Y$$

made it possible to precisely estimate the harmonics/noise content of the grid voltage signal.

The other important aspect of the Harmonic/Noise Decomposer block 20 is the fact that it is not sensitive to the precise value of ω. Thus, the value of ω can be pre-set to a default value (e.g., 2π60 rad/s). Thus, regardless of the value of ω, the Harmonic/Noise Decomposer is able to precisely estimate the harmonic/noise content of the grid voltage signal.

Referring to FIG. 4, one implementation of the decomposer block 20 has, as its input, the grid voltage ($v_g$) 110 while its outputs are $\hat{\xi}_1$ 120, which is the estimation of the harmonics/noise, and $\hat{x}$ 130, which is the grid voltage signal without the harmonics/noise content. The input 110 is received by three separate summation block 140, 150, 160, and a multiplier block 170. Summation block 140 adds the input 110 to the estimation output 120. The result of this summation block 140 is then fed into another summation block 180 which adds the result to an interim variable $\hat{\vartheta}_2$ 190. The result of summation block 180 is then multiplied by ω by way of a multiplication block 200. Summation block 210 then takes the result of multiplication block 200 and adds it to another interim variable $\hat{\xi}_2$. The result of summation block 210 is then added to the term $\mu_1\tilde{\vartheta}_1$ by way of summation block 220. The result of summation block 220 is then passed through an integration block 230 to result in the interim variable $\hat{\vartheta}_1$ 240.

Returning to the input 110 to the decomposer 100, this input is also received by summation block 150 that subtracts interim variable $\hat{\vartheta}_1$ 240 from the input 110. The result is interim variable $\tilde{\vartheta}_1$ 250. This interim variable 250 is multiplied using multiplier block 260 to result in the term $\mu_1\tilde{\vartheta}_1$. Similarly, this interim variable 250 is multiplied using multiplier block 270 to result in the term $\mu_2\tilde{\vartheta}_1$.

As noted above, input 110 is received by multiplier block 170. This multiplier block 170 multiplies the input 110 by the term 2ω and the result is fed into summation block 280. Summation block 280 subtracts the result of multiplier block 170 from the negative of the result of multiplier block 290. Block 290 multiplies the interim variable $\hat{\vartheta}_2$ 190 by the term ω. The result of summation block 280 is then added by summation block 295 with the term $\mu_2\tilde{\vartheta}_1$ and the result is fed into an integrator block 300. The result is the interim variable $\hat{\vartheta}_2$ 190.

The result of summation block 150 is also multiplied by $Y_1$ using multiplier block 310. The result of this block 310 is then passed through an integrator block 320 to result in interim variable $\hat{\xi}_2$. This is passed through another integrator block 330 to result in output $\hat{\xi}_1$ 120.

It should be noted that the other output $\hat{x}$ 130 is achieved by subtracting output $\hat{\xi}_1$ 120 from the input 110 by way of summation block 160.

The second block is the Frequency Estimator block 30. The Frequency Estimator block 30 extracts the frequency/phase information from the resulting sinusoidal signal (i.e., the resulting output of the Harmonic/Noise Decomposer block). The output of the Harmonic/Noise Decomposer block 20 is given by:

$$\hat{x}(t) = A\sin(\omega t + \varphi) \quad (8)$$

According to Eqn. (8), the dynamics of the system is given by:

$$Q_{Frq}^{Dynamic}: \begin{cases} \dot{q}_1 = q_2 \\ \dot{q}_2 = -\sigma q_1 \end{cases} \quad (9)$$

where $q = \hat{x}(t)$, $q_2 = \dot{q}_1$, and $\sigma = \omega^2$.

In order to estimate the parameter σ and, in turn, the frequency f, the following change of variables is used:

$$F_{Frq}^{Mapping}: \begin{cases} \dot{v}_1 = -\beta_1 v_1 - v_2 \\ v_2 = q_1 \\ v_3 = q_2 - \beta_1 v_2 - \sigma v_1 \end{cases} \quad (10)$$

According to Eqn. (10), the system dynamics with the new state variables are given by:

$$F_{Frq}^{Dynamic}: \begin{cases} \dot{v}_1 = -\beta_1 v_1 - v_2 \\ \dot{v}_2 = v_3 + \beta_1 v_2 + \sigma v_1 \\ \dot{v}_3 = -\beta_1 v_3 - \beta_1^2 v_2 \end{cases} \quad (11)$$

The observer for the frequency is designed as:

$$\Psi_{Frq}^{Obs}: \begin{cases} \dot{v}_1 = -\beta_1 v_1 - v_2 \\ \dot{\hat{v}}_2 = \hat{v}_3 + \beta_1 v_2 + \hat{\sigma} v_1 + \beta_2 \tilde{v}_2 \\ \dot{\hat{v}}_3 = -\beta_1 \hat{v}_3 - \beta_1^2 v_2 + \beta_3 \tilde{v}_2 \\ \dot{\hat{\sigma}} = \gamma_2 v_1 \tilde{v}_2 \\ \dot{\hat{\varphi}} = \gamma_3 \cos\hat{\theta}(v_2 - \hat{A}\sin\hat{\theta}) \\ \hat{\theta} = \int \sqrt{\hat{\sigma}}\, dt + \hat{\varphi} \end{cases} \quad (12)$$

where $\tilde{v}_2 = v_2 - \hat{v}_2$.

Figure 5:
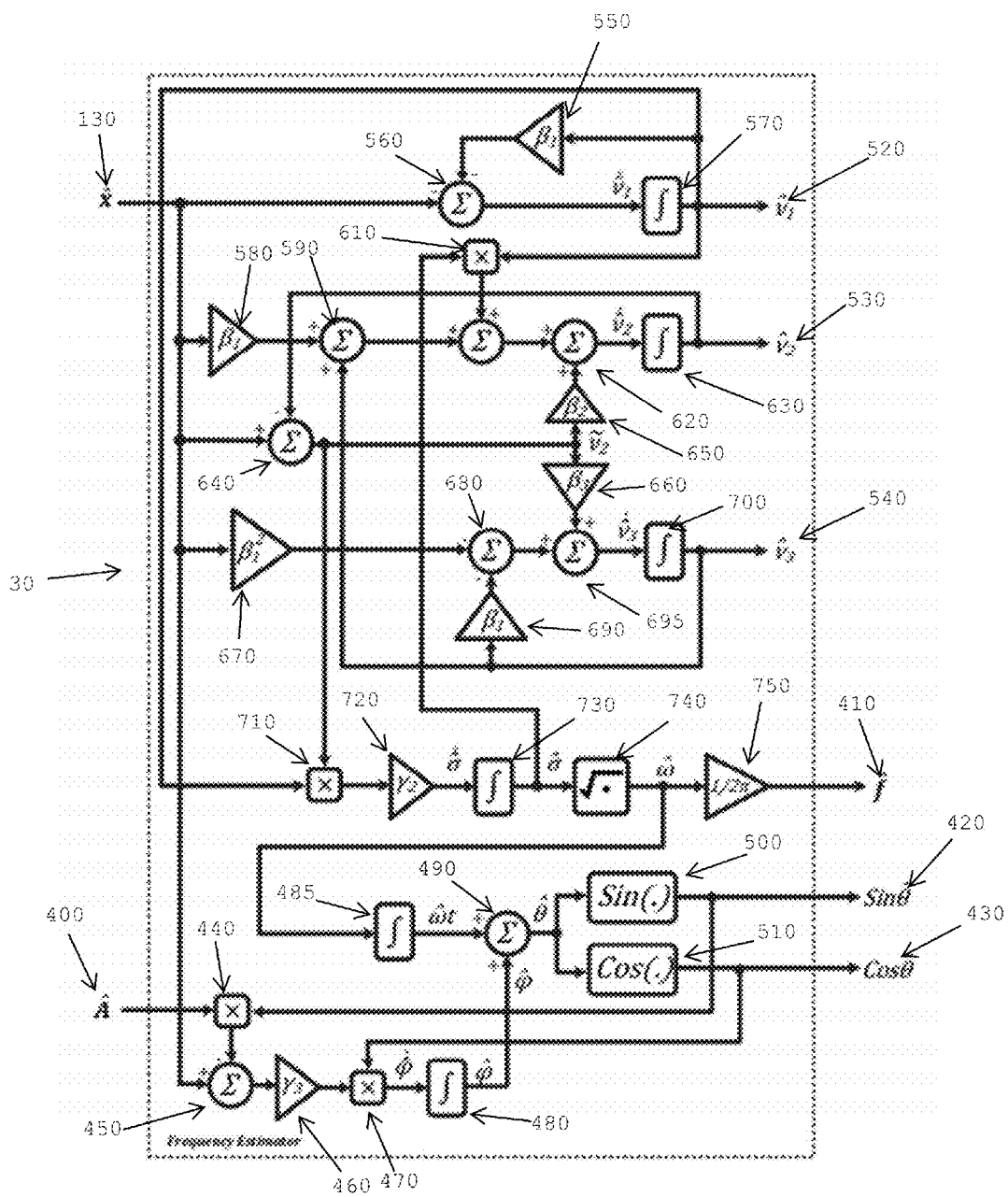
FIG. 5 is a block diagram of a frequency estimator block according to another aspect of the invention.

FIG. 5 shows the block diagram of the Frequency Estimator block, which is based on Eqn. (12). The outputs of this block is the phase information of the sinusoidal signal $\hat{x}$, namely $\hat{f}$, $\sin\hat{\theta}$ and $\cos\hat{\theta}$. As should be clear, $\hat{f}$ is the frequency of the signal and θ is the phase of the signal.

From FIG. 5, one implementation of the Frequency Estimator block is illustrated. The estimator block 30 has, as input, the output $\hat{x}$ 130 from the decomposer block and the output 400 of the amplitude estimator block 40. As noted above, the outputs of this block 30 are the frequency $\hat{f}$ 410 of the sinusoidal signal $\hat{x}$ 130 and the phase related values $\sin\hat{\theta}$ 420 and $\cos\hat{\theta}$ 430.

Input 400 is multiplied with output 420 by way of multiplier block 440. The result is then subtracted from input 130 by way of summation block 450. The result of this summation block is then multiplied by $\gamma_3$ by way of multiplier block 460. The result is then multiplied by output 430 by way of multiplier block 470. The result of this block 470 is then passed through integrator block 480. Integrator block 480 provides intermediate value $\hat{\varphi}$. This intermediate value is then added to the term $\hat{\omega}t$ (from integrator block 485) by way of summation block 490. The result of summation block 490 is $\hat{\theta}$. This value is then passed, in parallel, through sine block 500 and cosine block 510. The result of sine block 500 is the output 420 and the result of cosine block 510 is the output 430.

It should be noted that estimator block 30 also produces three interim outputs $\hat{v}_1$ 520, $\hat{v}_2$ 530, and $\hat{v}_3$ 540 which are used in determining the outputs of the estimator block 30. The interim output 520 is multiplied by multiplier block 550 by the value $\beta_1$. The result is subtracted from the negative of the input 130 by summation block 560. The result is then passed through integrator 570 to result in interim output 520.

The input 130 is received by multiplier block 580 which multiplies the input 130 by value $\beta_1$. The result of this multiplier block is added to the interim output 540 by way of summation block 590. The result of summation block 590 is then added, by summation block 600, to the product of interim output 520 and $\hat{\sigma}$. This product is produced by multiplier 610. The result of block 600 is then added to the value $\beta_2 \tilde{v}_2$ by summation block 620. The result is then passed through an integrator block 630 to result in the interim output 530.

It should be noted that input 130 is also received by summation block 640. This summation block subtracts interim output 530 from input 130 to result in value $\tilde{v}_2$. This value is then multiplied, in parallel, using multiplier blocks 650, 660 to result in the values $\beta_2 \tilde{v}_2$ and $\beta_3 \tilde{v}_2$.

The input 130 is also received by multiplier block 670 which multiplies input 130 by $\beta_1^2$. The result is then subtracted by summation block 680 from the negative of the result of multiplier block 690. Multiplier block 690 multiplies the interim output 540 by the value $\beta_1$. The result of summation block 680 is then added to the value $\beta_3 \tilde{v}_2$ (from multiplier block 660) by way of summation block 695. The result of this summation is passed through the integrator block 700. The result is the interim output 540.

The input 130 is also received by multiplier block 710 which multiplies the input 130 by the result of summation block 640. The result of this multiplier block 710 is then multiplied by multiplier block 720 by $\gamma_2$. The resulting value is then integrated by integrating block 730. The result of integrating block 730 is then passed through square root block 740 to produce $\hat{\omega}$. This is then multiplied by $$\frac{1}{2\pi}$$

by the multiplier block 750. This results in the output $\hat{f}$ 410.

The third block is the Amplitude Estimator block 40. In order to extract the amplitude, the output of the Harmonic/Noise Decomposer block 20 is used. This signal is a clean sinusoidal signal. Because of this, the harmonics/noise content has negligible impact on the amplitude estimation. In the present invention, the square value of the sinusoidal signal (i.e. the output of the Harmonic/Noise Decomposer block 20) is used to extract the amplitude of the sinusoidal signal. The output of the Harmonic/Noise Decomposer is given by:

$$\hat{x}(t) = A \sin(\omega t + \varphi) \quad (13)$$

Thus a new variable is defined as:

$$z(t) = 2\hat{x}^2(t) = \delta - \delta \cos(2\omega t + 2\varphi) \quad (14)$$

where $\delta = A^2$.

According to Eqn. (14), the dynamics of the system is given by:

$$Z_{Amp}^{Dynamic}: \begin{cases} \dot{z}_1 = 2\omega z_2 \\ \dot{z}_2 = 2\omega(\delta - z_1) \end{cases} \text{ where } \quad (15)$$

$$z_1 = z \text{ and } z_2 = \frac{1}{2\omega} \dot{z}_1.$$

In order to estimate the parameter $\delta$ and, in turn, the amplitude A, the following diffeomorphism mapping is used:

$$\Xi: Z \xrightarrow{\Lambda} N \quad (16)$$

$$N = \Lambda \cdot Z,$$

$$\Lambda = \begin{pmatrix} 1 & 0 & 0 \\ -1 & 1 & -1 \\ 0 & 0 & 1 \end{pmatrix}$$

$$Z = \begin{pmatrix} z_1 \\ z_2 \\ \delta \end{pmatrix} \in Z,$$

$$N = \begin{pmatrix} \eta_1 \\ \eta_2 \\ \delta \end{pmatrix} \in N$$

According to Eqn. (16), N and Z are diffeomorphic with the mapping $\Lambda$. It is worthwhile to mention that the importance of this mapping is to make the system observable for the term $\delta$ and, in turn, A (i.e., the amplitude of the sinusoidal signal $\hat{x}$).

The dynamics of the system in N using the mapping $$\Xi: Z \xrightarrow{\Lambda} N$$

is given by:

$$N_g^{Dynamic}: \begin{cases} \dot{\eta}_1 = 2\omega\eta_2 + 2\omega\eta_1 + 2\omega\delta \\ \dot{\eta}_2 = -4\omega\eta_1 - 2\omega\eta_2 \\ \dot{\delta} = \delta \end{cases} \quad (17)$$

The observer for the system in in N is designed as:

$$O_{Amp}^{Obs}: \begin{cases} \dot{\hat{\eta}}_1 = 2\omega\hat{\eta}_2 + 2\omega\hat{\eta}_1 + 2\omega\hat{\delta} + \alpha_1\tilde{\eta}_1 \\ \dot{\hat{\eta}}_2 = -4\omega\hat{\eta}_1 - 2\omega\hat{\eta}_2 + \alpha_2\tilde{\eta}_1 \\ \dot{\hat{\delta}} = 2\omega\gamma_4\tilde{\eta}_1 \end{cases} \quad (18)$$

where $\tilde{\eta}_1 = \eta_1 - \hat{\eta}_1$.

Figure 6:
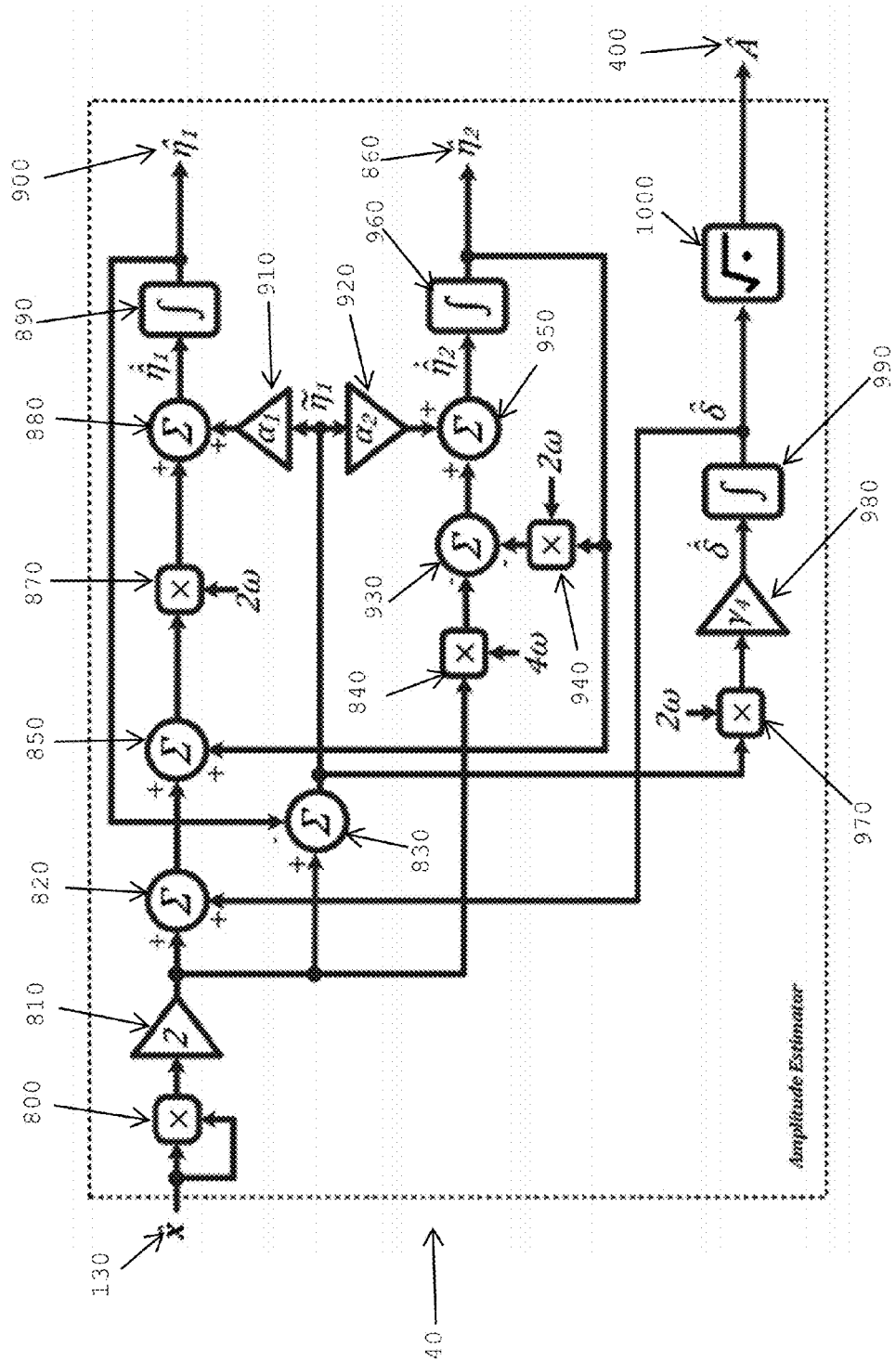
FIG. 6 is a block diagram of an amplitude estimator block according to another aspect of the invention.

FIG. 6 shows the block diagram of the Amplitude Estimator block, which is based on Eqn. (18). The output of this block is the amplitude of the sinusoidal signal $\hat{x}$, namely $\hat{\delta}$ or, as shown in FIG. 6, $\hat{A}$.

Referring to FIG. 6, the amplitude estimator block 40 has, as its input, the signal $\hat{x}$ 130 from the decomposer block 20. This input 130 is multiplied by itself (i.e. squared) by multiplier block 800 and the squared result is multiplied by multiplier block 810 by 2. The result of multiplier block 810 is then received by summation blocks 820, 830 and multiplier block 840.

The summation block 820 adds the result of multiplier block 810 to the value $\hat{\delta}$. From block 820, the result is then added by summation block 850 to the interim output $\hat{\eta}_2$ 860. The result from block 850 is then multiplied by multiplier block 870 with the value $2\omega$. From block 870, the result is added by summation block 880 to the value $\alpha_1\tilde{\eta}_1$. The result is passed through integrator block 890 to result in interim output $\hat{\eta}_1$ 900.

As noted above, the result from multiplier block 810 is received by summation block 830. Summation block 830 subtracts interim output 900 from this result from block 810. The resulting value, $\tilde{\eta}_1$, is then multiplied, in parallel, by multiplier blocks 910, 920 to result in the values $\alpha_1\tilde{\eta}_1$ and $\alpha_2\tilde{\eta}_1$.

Also as noted above, the result from multiplier block 810 is received by multiplier block 840. This block 8540 multiplies the result from block 810 by $4\omega$ and the result is subtracted by summation block 930 from the negative of the result of multiplier block 940. Block 940 multiplies the interim output 860 by $2\omega$. The result of block 930 is then added by summation block 950 to the value $\alpha_2\tilde{\eta}_1$ from multiplier block 920. The result of block 950 then passed through integrator block 960 to result in the interim output 860.

The final branch of the block 40 has the result of summation block 830 being multiplied by $2\omega$ by multiplier block 970. The result of this block 970 is then multiplied by multiplier block 980 with value $Y_3$. From this block 980, the result is passed through integrator block 990. A square root function is then applied to the result of this block 990 by square root block 1000 to result in output $\hat{A}$ 400.

Figure 7:
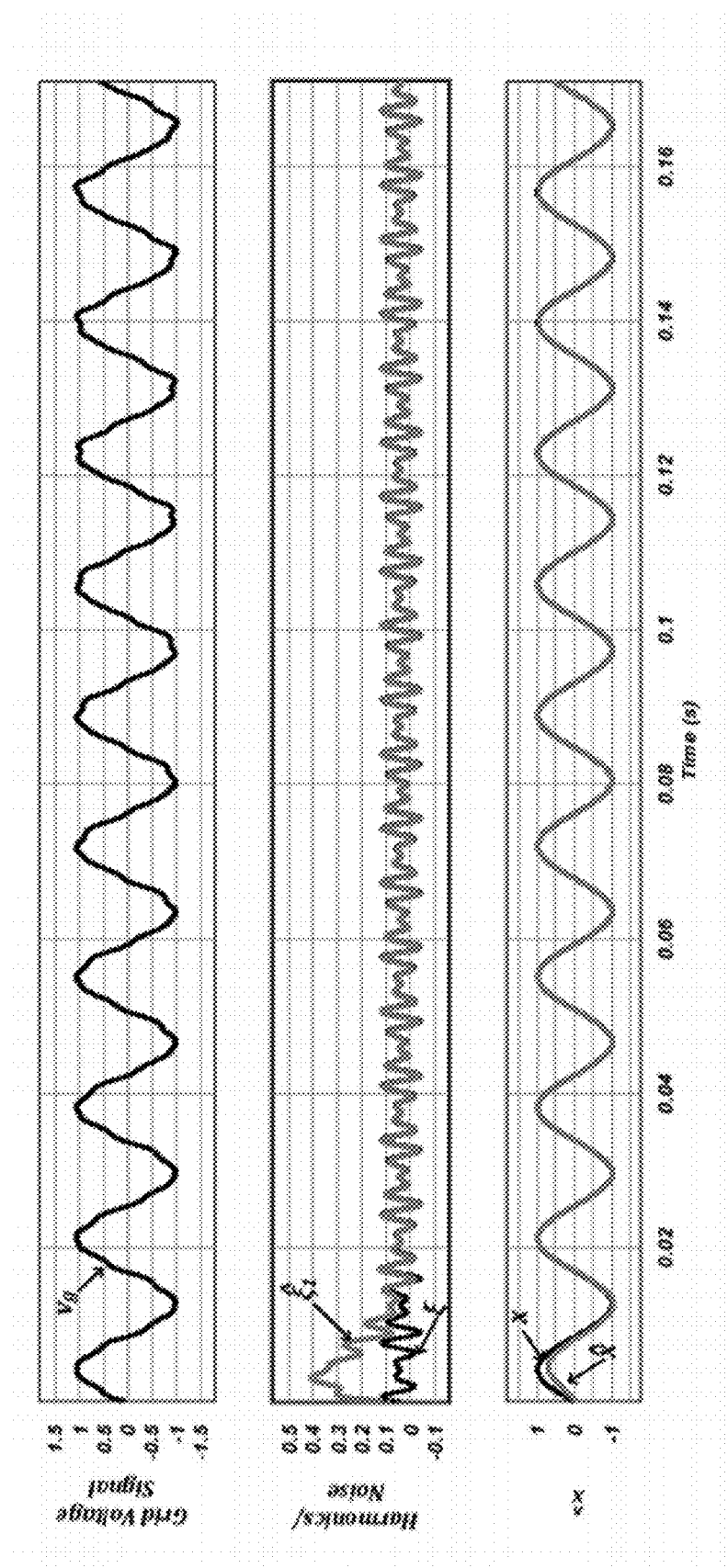
FIG. 7 are time domain waveforms of simulation results for the harmonic/noise decomposer.
Figure 8:
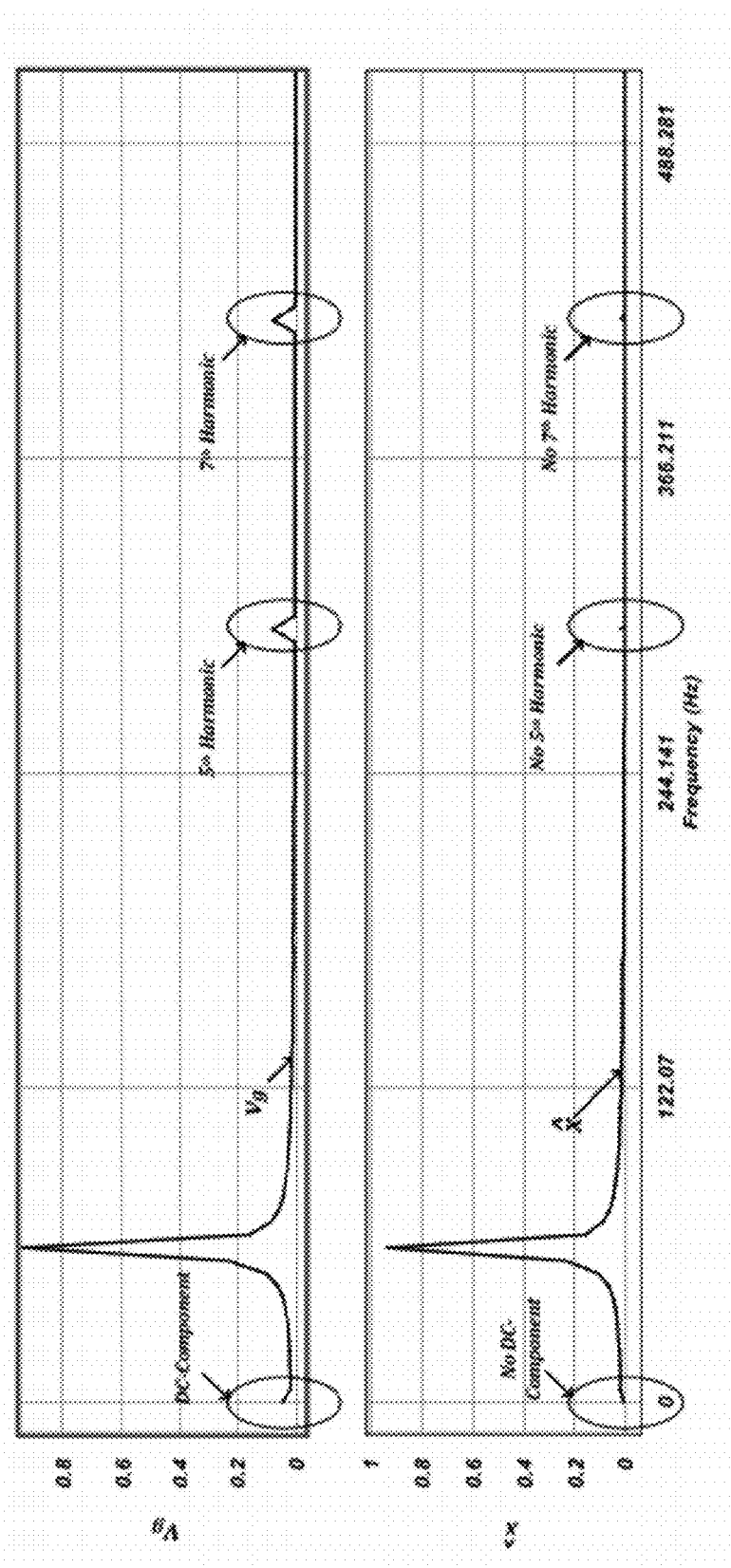
FIG. 8 are frequency domain waveforms of simulation results for the harmonic/noise decomposer.
Figure 9:
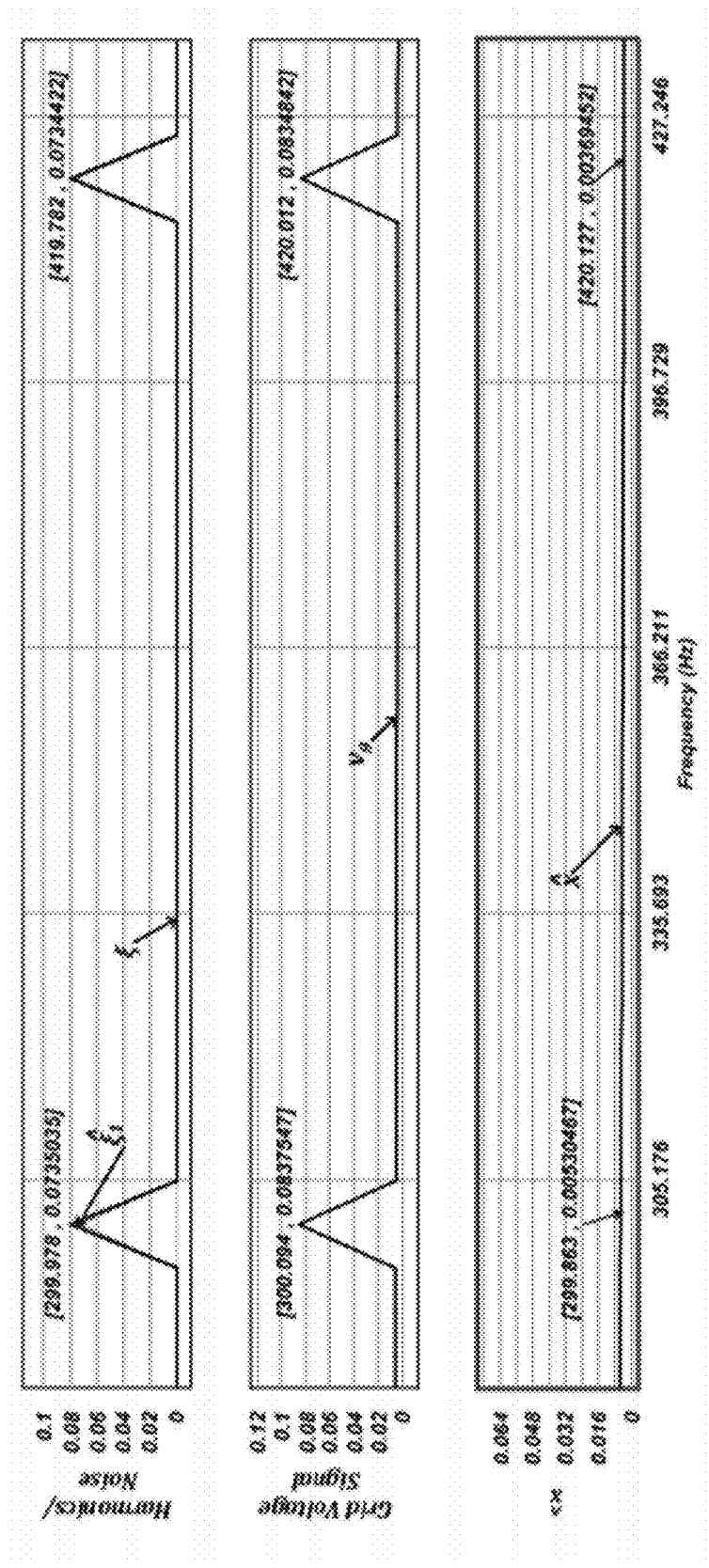
FIG. 9 are enlarged versions of frequency domain waveforms for simulation results for the harmonic/noise decomposer.

In order to evaluate the performance of the hybrid observer, a computer simulation has been conducted. In this simulation a polluted signal is given as the grid voltage. FIG. 7, FIG. 8, and FIG. 9 show the performance of the Harmonic/Noise Decomposer block. In this simulation, the pollution in the signal took the form and extent consisting of a 4% of the dc-component, a 4% of the $5^{th}$ harmonic of a 60 Hz sinusoidal signal (i.e., 300 Hz) and a 4% of the $7^{th}$ harmonic of a 60 Hz sinusoidal signal (i.e., 420 Hz) to a 100% of the fundamental component with the frequency of 59 Hz. FIG. 7 shows that the Harmonic/Noise Decomposer block is able to isolate the harmonic/noise content of the signal and to extract the fundamental component in the presence of the harmonics and noise. It is important to note that the Harmonic/Noise Decomposer block is able to effectively estimate the dc-component as well as the harmonics.

FIG. 8 shows the performance of the Harmonic/Noise Decomposer block in the frequency domain. FIG. 8 confirms that the Harmonic/Noise Decomposer block can decouple the fundamental component from the harmonics/Noise. FIG. 9 is an enlarged version of FIG. 8 and shows that the Harmonic/Noise Decomposer block precisely estimates different components of the grid voltage signal.

Figure 10:
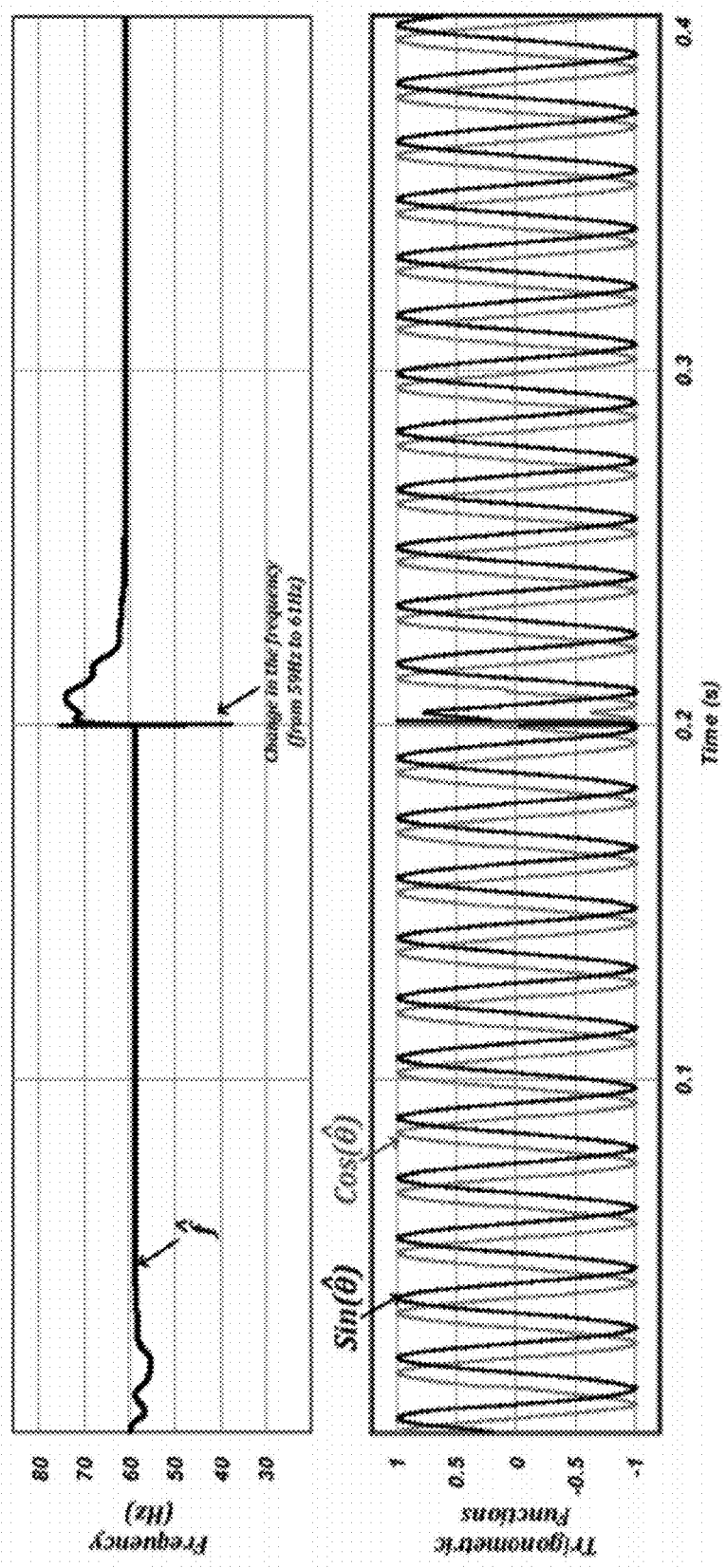
FIG. 10 are waveforms showing the frequency tracking performance of the frequency estimator block.
Figure 11:
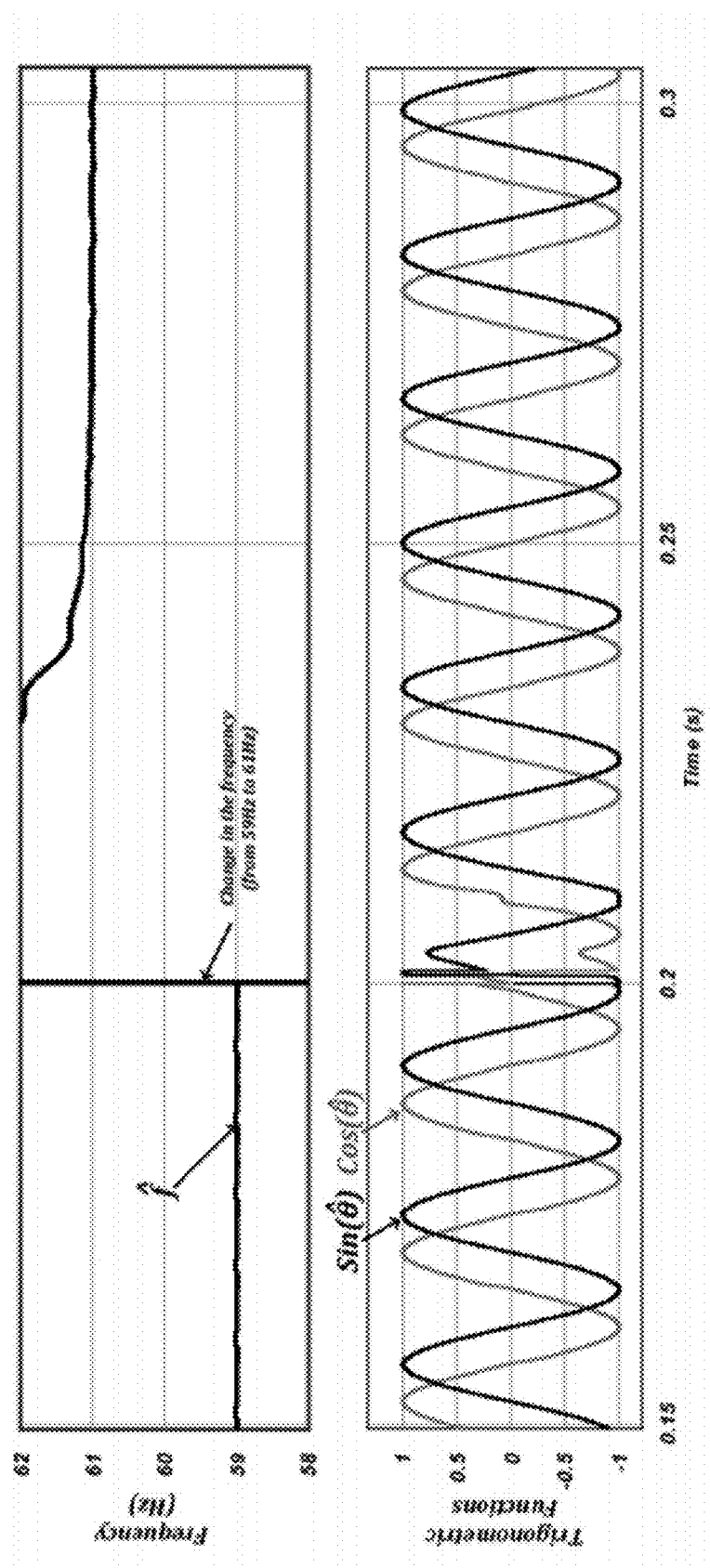
FIG. 11 is an enlarged version of sections of FIG. 10.

FIG. 10 and FIG. 11 show the performance of the Frequency Estimator block. FIG. 10 illustrates the frequency tracking performance of the Frequency Estimator block. In this figure, a step change from 59 Hz to 61 Hz is applied. FIG. 10 shows that the Frequency Estimator block can precisely track the change in the frequency. FIG. 11 is an enlarged version of FIG. 10 and shows that the Frequency Estimator block is able to accurately estimate the frequency of the clean sinusoidal signal $\hat{x}$.

Figure 12:
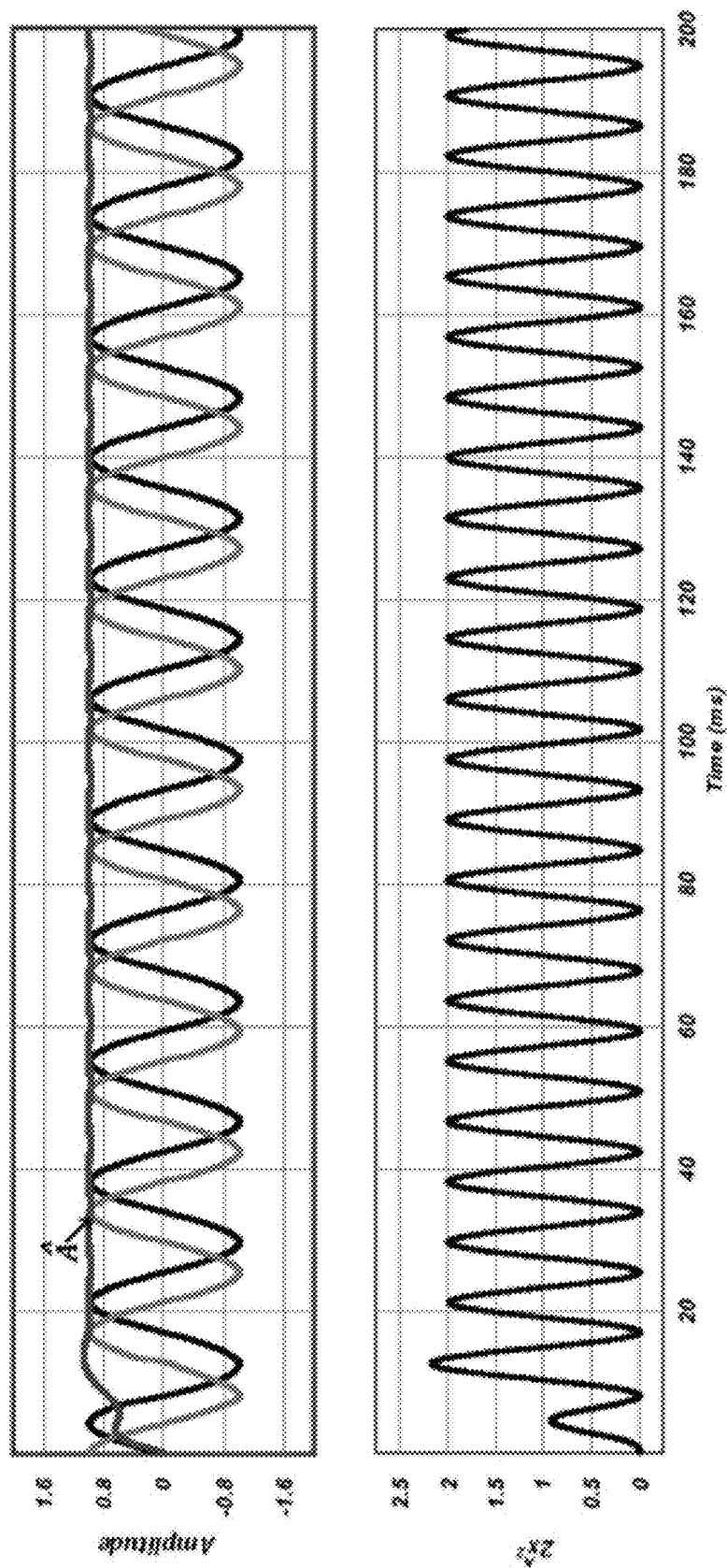
FIG. 12 are waveforms of simulation results for the amplitude estimator block.

FIG. 12 shows the performance of the Amplitude Estimator block. FIG. 12 illustrates that the Amplitude Estimator block can precisely and quickly estimate the amplitude of the clean sinusoidal signal $\hat{x}$.

It should be noted that the systems and modules according to the present invention may be implemented using multiple methods. The present invention may be implemented using ASIC (application specific integrated circuit) technology or it may be implemented such that each block is implemented separately from the other blocks. Similarly, the present invention may be implemented using any suitable data processing device including a general data processor such as a general purpose computer. Alternatively, the present invention may be implemented using a dedicated data processing device specific for the use of the present invention.

It should be noted that the functions and relationships detailed by Eqns. (7), (12), and (18) may be implemented using a general purpose computer using a suitable signal processing interface. The resulting values and/or signals can then be used in conjunction with a DG to synchronize grid-connected power converters with the grid. The values and/or signals from the general purpose computer can be used as input to a suitable interface with the power converter to thereby synchronize the power converter with the grid.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g. "C") or an object-oriented language (e.g. "C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

We claim:

1. A system to synchronize grid-connected power converters with a power grid including establishing parameters of an incoming grid voltage signal, the system comprising:
   a harmonic/noise decomposer embodied in a first circuit that decomposes said incoming grid voltage signal, said harmonic/noise decomposer receiving said incoming grid voltage signal and, from said incoming grid voltage signal, producing an estimate of a harmonic/noise component of said incoming grid voltage signal and a sinusoidal clean voltage signal that is said incoming grid voltage signal without said harmonic/noise component;
   a frequency estimator embodied in a second circuit that estimates a frequency and phase angle of said incoming grid voltage signal, said frequency estimator receiving said sinusoidal clean voltage signal from said harmonic/noise decomposer and producing an estimate of a frequency of said sinusoidal clean voltage signal and values related to a phase angle of said sinusoidal clean voltage signal; and
   an amplitude estimator embodied in a third circuit that estimates an amplitude of said incoming grid voltage signal, said amplitude estimator receiving said sinusoidal clean voltage signal from said harmonic/noise decomposer and producing an estimate of an amplitude of said sinusoidal clean voltage signal from said sinusoidal clean voltage signal;
wherein
   said estimate of said amplitude of said sinusoidal clean voltage signal from said amplitude estimator is received by said frequency estimator, and at least each said estimated harmonic/noise component, estimated frequency, and estimated amplitude are provided to an interface with a grid-connected power converter.

2. The system according to claim 1, wherein said incoming grid voltage signal is a voltage of a utility power grid.

3. The system according to claim 1, wherein said first circuit embodying said harmonic/noise decomposer is represented by:

$$\Theta_g^{Obs}: \begin{cases} \dot{\hat{\vartheta}}_1 = \omega \hat{\vartheta}_2 + \omega \vartheta_1 + \omega \hat{\xi}_1 + \hat{\xi}_2 + \mu_1 \tilde{\vartheta}_1 \\ \dot{\hat{\vartheta}}_2 = -2\omega \vartheta_1 - \omega \hat{\vartheta}_2 + \mu_2 \tilde{\vartheta}_1 \\ \dot{\hat{\xi}}_1 = \hat{\xi}_2 \\ \dot{\hat{\xi}}_2 = \gamma_1 \tilde{\vartheta}_1 \end{cases}$$

where
$\tilde{\vartheta}_1 = \vartheta_1 - \hat{\vartheta}_1$; and
$\hat{\xi}_1$, is an estimate of said harmonic/noise component.

4. The system according to claim 1, wherein said second circuit embodying said frequency estimator is represented by:

$$\Psi_{Frq}^{Obs}: \begin{cases} \dot{v}_1 = -\beta_1 v_1 - v_2 \\ \dot{\hat{v}}_2 = \hat{v}_3 + \beta_1 v_2 + \hat{\sigma} v_1 + \beta_2 \tilde{v}_2 \\ \dot{\hat{v}}_3 = -\beta_1 \hat{v}_3 - \beta_1^2 v_2 + \beta_3 \tilde{v}_2 \\ \dot{\hat{\sigma}} = \gamma_2 v_1 \tilde{v}_2 \\ \dot{\hat{\varphi}} = \gamma_3 \cos\hat{\theta}(v_2 - \hat{A}\sin\hat{\theta}) \\ \hat{\theta} = \int \sqrt{\hat{\sigma}}\, dt + \hat{\varphi} \end{cases}$$

wherein
$\tilde{v}_2 = v_2 - \hat{v}_2$;
$\hat{\theta}$ is an estimate of said phase angle of said incoming signal; and $$\hat{f} = \frac{\sqrt{\hat{\sigma}}}{2\pi} = \text{estimated frequency of said incoming signal.}$$

5. The system according to claim 1, wherein said third circuit embodying said amplitude estimator is represented by:

$$O_{Amp}^{Obs}: \begin{cases} \dot{\hat{\eta}}_1 = 2\omega \hat{\eta}_2 + 2\omega \eta_1 + 2\omega \hat{\delta} + \alpha_1 \tilde{\eta}_1 \\ \dot{\hat{\eta}}_2 = -4\omega \eta_1 - 2\omega \hat{\eta}_2 + \alpha_2 \tilde{\eta}_1 \\ \dot{\hat{\delta}} = 2\omega \gamma_4 \tilde{\eta}_1 \end{cases}$$

where
$\tilde{\eta}_1 = \eta_1 - \hat{\eta}_1$; and
$\hat{A} = \sqrt{\hat{\delta}} =$ estimated amplitude for said incoming signal.

6. The system according to claim 1, wherein said system is used to estimate parameters for a grid voltage for a power utility grid.

7. The system according to claim 6, wherein said parameters are for use in synchronizing said grid-connected power converter connected to said power utility grid.

* * * * *